US008866555B2

(12) United States Patent
Manetakis

(10) Patent No.: US 8,866,555 B2
(45) Date of Patent: Oct. 21, 2014

(54) POWER AMPLIFIER WITH VARIABLE OUTPUT IMPEDANCE

(75) Inventor: Konstantinos Manetakis, Nice (GR)

(73) Assignee: Cambridge Silicon Radio Limited, Cambridge (GB)

(*) Notice: Subject to any disclaimer, the term of this patent is extended or adjusted under 35 U.S.C. 154(b) by 0 days.

(21) Appl. No.: 13/598,180

(22) Filed: Aug. 29, 2012

(65) Prior Publication Data

US 2014/0062591 A1 Mar. 6, 2014

(51) Int. Cl.
*H03F 3/191* (2006.01)

(52) U.S. Cl.
USPC .......................................... 330/305; 330/196

(58) Field of Classification Search
CPC ....... H03F 3/191; H03F 3/193; H03F 3/1935; H03F 3/195; H03F 2200/108
USPC .................. 330/195, 196, 302, 305
See application file for complete search history.

(56) References Cited

U.S. PATENT DOCUMENTS

| 6,349,216 | B1 | 2/2002 | Alberth, Jr. et al. |
| 7,151,411 | B2 | 12/2006 | Martin et al. |
| 8,174,315 | B1 | 5/2012 | Mangold et al. |
| 8,270,926 | B2* | 9/2012 | Roufoogaran et al. ....... 455/292 |
| 8,378,750 | B2* | 2/2013 | Sutardja et al. .............. 330/264 |
| 2005/0208917 | A1 | 9/2005 | Roufoogaran et al. |
| 2008/0278258 | A1 | 11/2008 | Liu |
| 2011/0128088 | A1 | 6/2011 | Jin et al. |
| 2012/0075019 | A1* | 3/2012 | Visser et al. ................. 330/196 |

FOREIGN PATENT DOCUMENTS

| JP | 2009-130897 A | 6/2009 |
| WO | WO-2007/010543 A1 | 1/2007 |

OTHER PUBLICATIONS

Search Report issued for United Kingdom Patent Application No. GB1313729.4 dated Jan. 28, 2014, 2 pages.

* cited by examiner

*Primary Examiner* — Steven J Mottola
(74) *Attorney, Agent, or Firm* — Fulbright & Jaworski LLP

(57) ABSTRACT

A power amplifier circuit, comprising: an amplifier for receiving an input signal to be amplified; a power input for coupling the amplifier to a power supply; and a transformer for providing the amplified signal from the amplifier to a load, comprising a primary inductor and a secondary inductor. The power amplifier circuit is characterized by: a first capacitor coupled in parallel with the primary inductor; and a second capacitor coupled in parallel with the secondary inductor; wherein at least one of the first and second capacitors has a variable capacitance.

11 Claims, 3 Drawing Sheets

POWER AMPLIFIER WITH VARIABLE OUTPUT IMPEDANCE

TECHNICAL FIELD

The present invention relates to power amplifiers, and particularly to power amplifiers for amplifying radio-frequency signals.

BACKGROUND OF THE INVENTION

FIG. 1 shows the basic general topology of a power amplifier 10. An impedance transformer 12 interfaces a load $R_L$ to an active device M and a power supply $V_{DD}$. In this example the active device M is a transistor. One function of the impedance transformer 12 is to maximize the efficiency of energy transfer from the supply to the load. For this, it should ideally transform the load impedance $R_L$ to a value $R_x$ seen at the drain of the transistor M, so that for given power delivered on $R_L$, the drain of the active device swings fully from 0 to $2V_{DD}$.

For maximum efficiency, therefore, $$\frac{V_{DD}^2}{2R_x} = \frac{V_L^2}{2R_L} = P_L \xrightarrow{yields} R_x = \frac{V_{DD}^2}{2P_L}, \quad (1)$$

where $V_L$ is the voltage across the load $R_L$, and $P_L$ is the power delivered to the load $R_L$. In the case where the active device M is a differential amplifier, equation (1) becomes $$R_x = \frac{(2V_{DD})^2}{2P_L} = \frac{2V_{DD}^2}{P_L}. \quad (2)$$

The optimum value of $R_x$ thus depends on the supply voltage and the power delivered to the load. For example, while working at constant supply voltage and reducing the power delivered to the load (power step-down), high efficiency may be maintained by increasing $R_x$ accordingly. Alternatively, while working under variable supply voltage and delivering constant power to the load, varying the value of $R_x$ allows for the most efficient operation.

There may also be applications with requirements for operating the power amplifier at its maximum achievable efficiency while varying both the supply voltage as well as the power delivered to the load. Such examples include battery-attached power amplifiers, power amplifiers that are required to meet the specifications of multiple standards etc.

In most modern realizations of integrated power amplifiers, the impedance transformer is implemented by means of a planar integrated transformer comprising primary and secondary inductors having inductances $L_1$ and $L_2$ respectively. The load $R_L$ is coupled across the secondary inductor. Such a transformer transforms the load impedance $R_L$ by a ratio n according to:

$$n = \frac{1}{k}\sqrt{\frac{L_2}{L_1}}, \quad (3)$$

where k is the magnetic coupling factor linking the primary and secondary inductors, and $0 \leq k \leq 1$. The transformation ratio is thus defined by the values of the primary and secondary inductances, as well as the magnetic coupling factor. These values, however, are set by the physical geometry of the transformer and are difficult or impossible to change once the design of the chip is in place. This limits the maximum efficiency achieved by the power amplifier when operating under different supply voltages and/or at different power levels.

One solution to this problem has been to provide one or more switches to switch in or out sections of the transformer, thus altering the inductances and the transformation ratio n as the power supply or load requirements vary. However, the switches themselves require power to operate and thus result in a loss of efficiency.

BRIEF SUMMARY OF THE INVENTION

According to a first aspect of the present invention, there is provided a power amplifier circuit, comprising: an amplifier for receiving an input signal to be amplified; a power input for coupling the amplifier to a power supply; and a transformer for providing the amplified signal from the amplifier to a load, comprising a primary inductor and a secondary inductor. The power amplifier circuit is characterized by: a first capacitor coupled in parallel with the primary inductor; and a second capacitor coupled in parallel with the secondary inductor; wherein at least one of the first and second capacitors has a variable capacitance.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a better understanding of the present invention, and to show more clearly how it may be carried into effect, reference will now be made, by way of example, to the following drawings, in which.

DETAILED DESCRIPTION OF THE INVENTION

Figure 1:
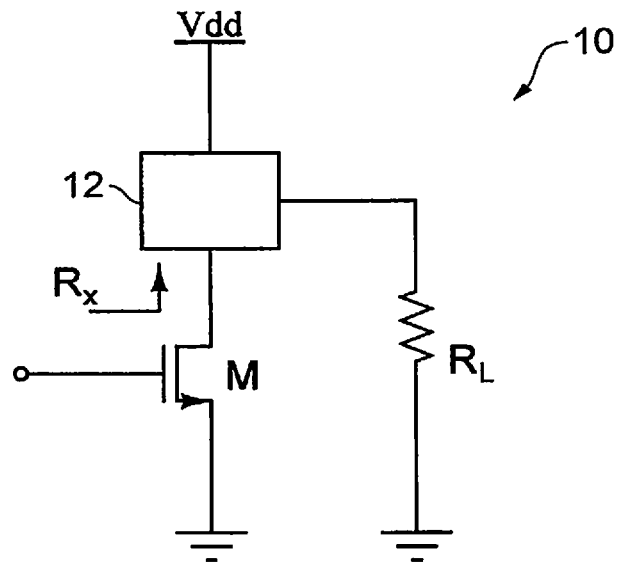
FIG. 1 is a schematic representation of a power amplifier circuit.
Figure 2:
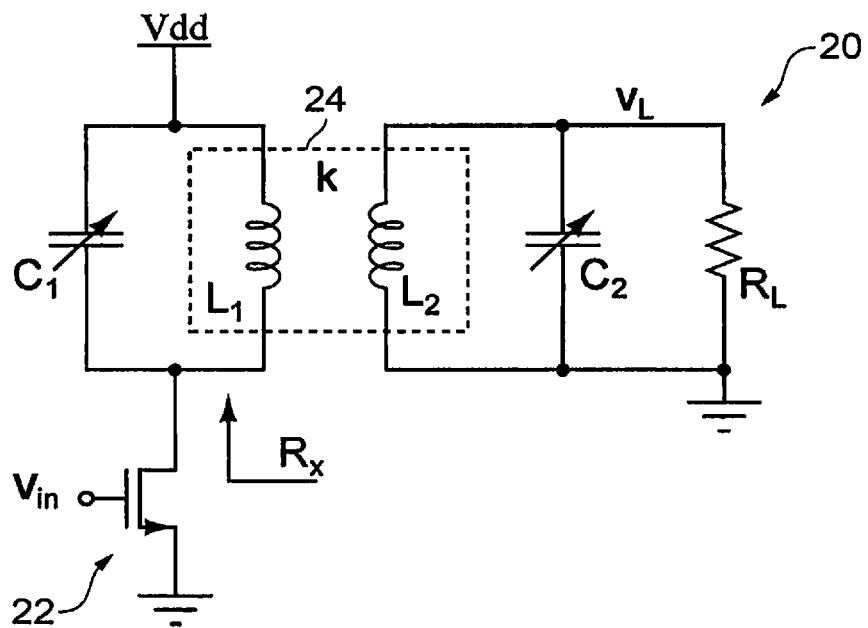
FIG. 2 is a schematic representation of a power amplifier circuit according to an embodiment of the present invention.

FIG. 2 shows a power amplifier circuit 20 according to aspects of the present invention. The circuit comprises an amplifier 22, acting in the illustrated embodiment as the final stage of a transmitter, connected to a power supply $V_{DD}$ via a transformer 24. The transformer comprises a first inductor $L_1$ magnetically coupled (with constant k) to a second inductor $L_2$. The second inductor $L_2$ is connected across a load $R_L$. The outputs of the amplifier circuit 20 are thus the connections from the second inductor $L_2$ to the load $R_L$.

In the illustrated embodiment the amplifier 22 is a transistor, with its gate terminal connected to an input voltage to be amplified ($V_{IN}$), its source terminal connected to a reference voltage (in this embodiment, ground), and its drain terminal connected to the transformer 24. It will be understood by those skilled in the art that alternative amplifying elements could be used instead of the transistor without substantially affecting the operation of the circuit or departing from the scope of the invention. For example, the amplifier 22 may comprise more than one amplifying element operating in parallel or series. Moreover, the amplifier 22 may be operated in a differential manner, with more than one input signal.

According to embodiments of the present invention, the power amplifier circuit 20 further comprises a variable capacitor $C_1$ connected in parallel with the inductor $L_1$. In the illustrated circuit, the variable capacitor $C_1$ is further connected between the output (drain terminal) of the amplifier 22 and the power supply $V_{DD}$; however, in alternative arrangements (such as a differential amplifier) this connection may be different. A second variable capacitor $C_2$ is connected in parallel with the inductor $L_2$, across the outputs of the power amplifier circuit 20 (and therefore across the load $R_L$). In embodiments of the invention, the capacitors $C_1$ and $C_2$ can each take one of a plurality of discrete capacitance values. Thus, as an example, $C_1$ and $C_2$ may each be able to take capacitance values from the set {1 pF, 2 pF, 3 pF, 4 pF, 5 pF} although any set of values can be provided.

The resistance $R_x$ looking into the primary inductor $L_1$ from the output of the amplifier 22 can be altered solely by controlling the values of capacitors $C_1$ and $C_2$.

Figure 3A:
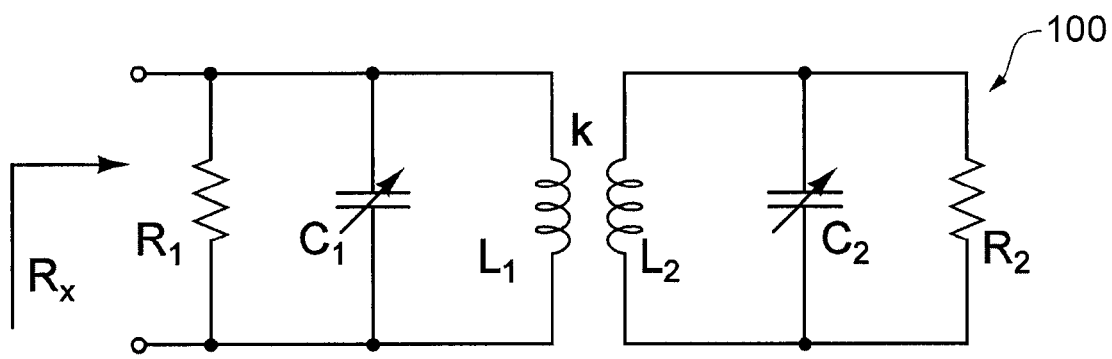
FIGS. 3a and 3b show equivalent circuits used to model the power amplifier circuit of FIG. 2.
Figure 3B:
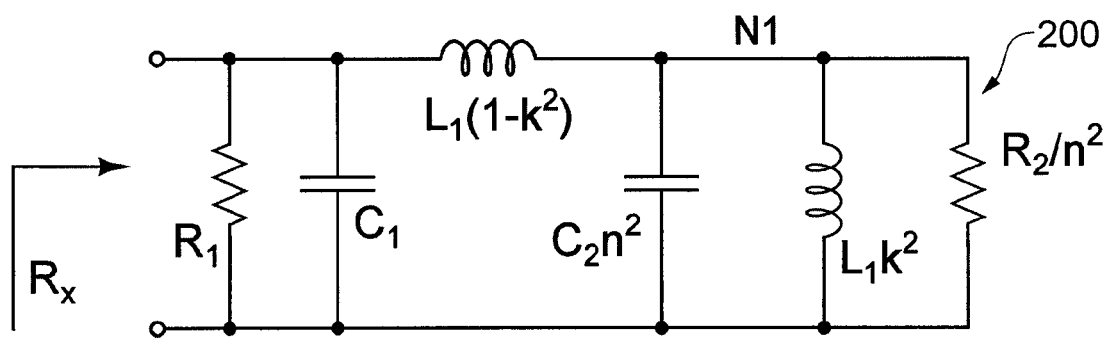

To explain how this is achieved, FIG. 3a shows a first equivalent network 100 for part of the circuit 20, while FIG. 3b shows a second equivalent circuit 200 which may be used to calculate the impedance $R_x$ looking into the primary inductor $L_1$.

The first equivalent network 100 comprises a first resistance $R_1$ connected between two input terminals, representing the loss on the primary side of the transformer. $R_1$ may be given by $2\pi f Q_1 L_1$, where $f$ is the frequency of operation and $Q_1$ is the Q factor of the inductor $L_1$. The variable capacitor $C_1$ (i.e. the same capacitor as shown in FIG. 2) is connected in parallel with the resistance $R_1$, and the primary inductor $L_1$ is connected in parallel with both the resistance $R_1$ and the capacitor $C_1$. The secondary inductor $L_2$, the second variable capacitor $C_2$ and a resistance $R_2$ are all connected in parallel with each other, and the secondary inductor $L_2$ is coupled to the primary inductor by a coupling factor k. The resistance $R_2$ represents the parallel combination of the load resistor $R_L$ (in FIG. 2) and the loss on the secondary side. The loss can be modelled by $2\pi f Q_2 L_2$, where $Q_2$ is the Q factor of the inductor $L_2$. Thus $$\frac{1}{R_2} = \frac{1}{R_L} + \frac{1}{2\pi f Q_2 L_2}$$

The second circuit 200, equivalent to the circuit 100, has the resistance $R_1$, the capacitance $C_1$, a further capacitance $C_2 n^2$, an inductance $L_1 k^2$ and a resistance $R_2/n^2$ all connected in parallel with each other between the two input terminals. A further inductance having value $L_1(1-k^2)$ is connected in series with one of the input terminals, between the capacitances $C_1$ and $C_2 n^2$. It can be seen therefore that the transformer action is to transform resistor $R_2$ and capacitor $C_2$ to the primary side by a factor $n^2$ (given above in Equation 3). Inductance $L_1 k^2$ is the magnetizing inductance that represents the part of the primary inductor $L_1$ that actually transfers energy to the secondary inductor $L_2$. Inductance $L_1(1-k^2)$ represents the leakage inductance that simply recycles energy in the local field and does not participate in energy exchange between the primary and the secondary inductors.

Figure 4A:
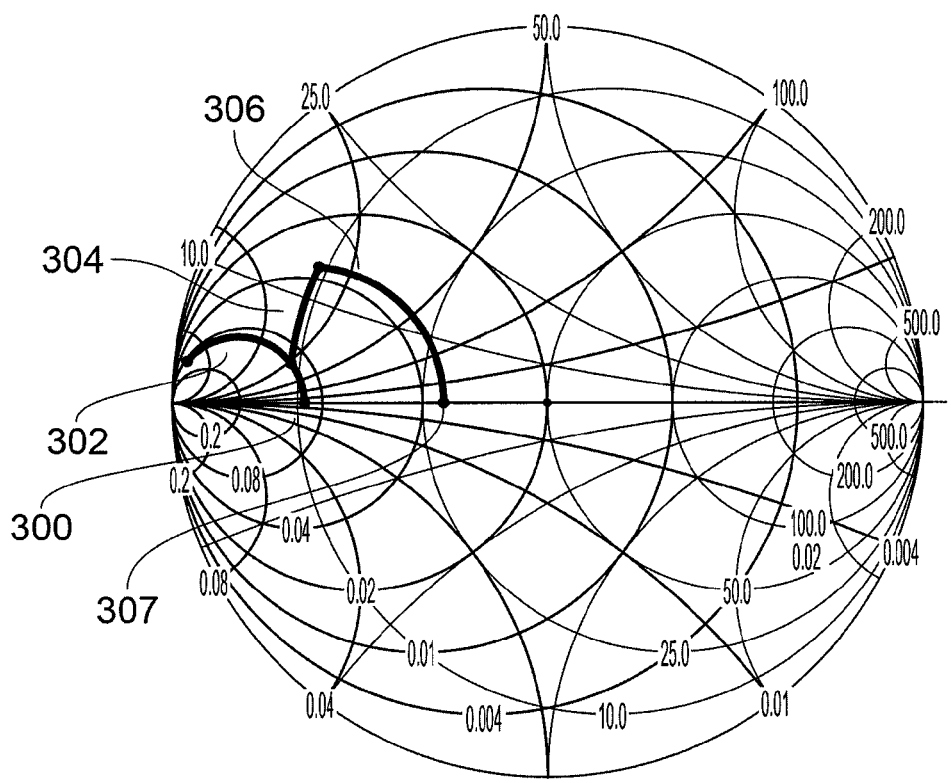
FIGS. 4a and 4b are Smith charts analysing the input impedance of the power amplifier circuit shown in FIG. 2 given two sets of values.
Figure 4B:
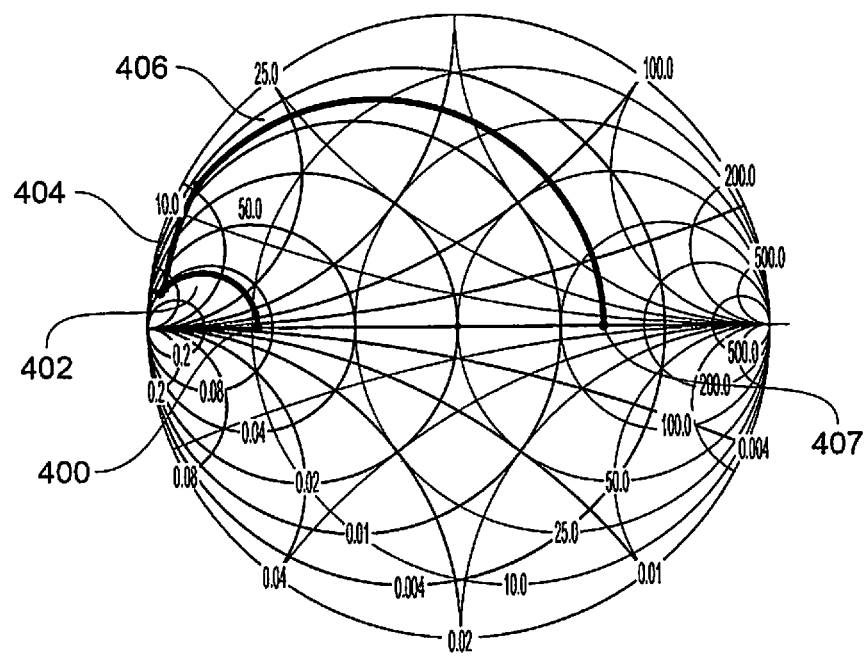

FIGS. 4a and 4b show Smith charts calculating the impedance of the circuit 200 for various sets of parameter values. The Figures are first referred to generally, to enable an understanding of the invention and the way in which the impedance $R_x$ is altered by varying the values of $C_1$ and $C_2$. The calculations themselves are described in greater detail later.

Looking first at the node N1, on the far side of the inductance $L_1(1-k^2)$ from the input terminals, it can be seen that the parallel combination of $C_2 n^2$ and $L_1 k^2$ effectively alters only the imaginary part of the impedance into the node. The real part of that impedance remains constant at $R_2/n^2$ as defined by the transformer geometry (i.e. equation 3) and the value of $R_2$. This is represented in the Smith charts of FIGS. 4a and 4b by the initial starting points 300 and 400, respectively (representing the real impedance $R_2/n^2$). The parallel combination of $C_2 n^2$ and $L_1 k^2$ is represented by movement on constant admittance circles 302, 402. The effect of the inductance $L_1(1-k^2)$ is shown in the constant impedance circles 304, 404, and the effect of the capacitance $C_1$ is shown in the constant admittance circles 306, 406. The combined effect is to transform the real part of the impedance $R_x$ from $R_2/n^2$ to a greater value (i.e. one that is further towards the right of the chart—see points 307 and 407 in FIGS. 4a and 4b respectively).

The values of the parameters in the illustrated Smith charts are as follows. In both FIGS. 4a and 4b: $R_L$=50 Ω, $L_1$=825 pH, $Q_1$=15, $L_2$=750 pH, $Q_2$=15 and k=0.5 (thus n=1.9). Again, in both FIGS. 4a and 4b, the starting points 300 and 400 are the same $(R_L//2\pi f Q_2 L_2)/n^2$=10.7 Ω. Note that the primary loss resistance is $R_1$=$2\pi f Q_1 L_1$=191 Ω. The values of the capacitances $C_1$ and $C_2$ differ between FIGS. 4a and 4b, to show the effect of varying the capacitances on the impedance $R_x$. In FIG. 4a, $C_1$=3.3 pF and $C_2$=5 pF; in FIG. 4b, $C_1$=5 pF and $C_2$=1 pF. In FIG. 4a, $R_x$=28.4 Ω//$R_1$=25 Ω; in FIG. 4b, $R_x$=139 Ω//$R_1$=80 Ω. Thus, purely by varying the capacitances $C_1$ and $C_2$ the resistance into the transformer 24 can be altered (in the illustrated examples of FIGS. 4a and 4b from 10 Ω to 25 Ω and 80 Ω respectively).

In fact, it will also be seen that an effective transformation in the value of $R_x$ may be brought by varying just one of $C_1$ and $C_2$. Thus, in some embodiments of the present invention, only one of the capacitors $C_1$ and $C_2$ is variable, and the other has a fixed capacitance.

In all of the above, the symbol. "//" represendts the paralled combination of impedances on either side of the symbol; thus $Z_1//Z_2$ is equivalent to $$\frac{1}{Z_{total}} = \frac{1}{Z_1} + \frac{1}{Z_2},$$

where $Z_{total}$ is the equivalent impedance of two impedances $Z_1$ and $Z_2$ connected in parallel.

Thus, the present invention provides a power amplifier circuit with capacitors having variable capacitance values such that the power amplifier circuit can operate at a given efficiency for respective values of the supply voltage and the power delivered to the load.

Figure 5:
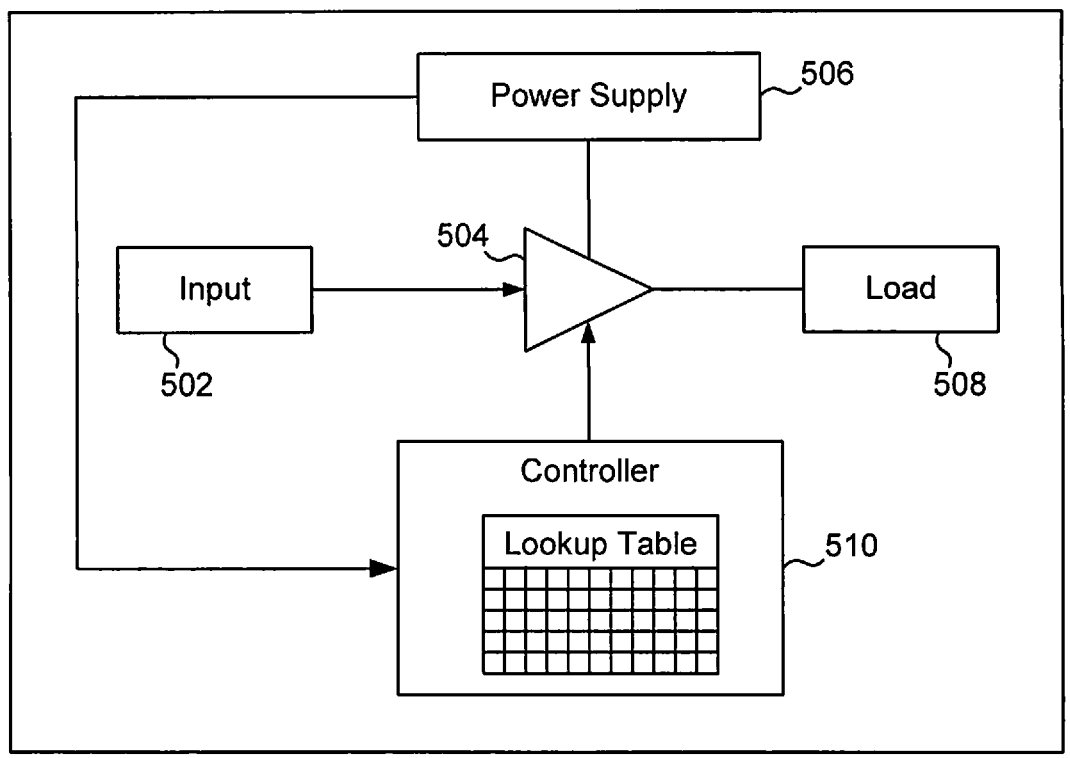
FIG. 5 shows a device according to embodiments of the present invention.

FIG. 5 shows a device 500 according to embodiments of the invention, incorporating the power amplifier circuit described above. The device 500 can be any electrical device incorporating power amplifier circuits, but in one embodiment is a telecommunications device such as a transmitter.

The device comprises an input 502, for receiving an input signal ($V_{IN}$), connected to a power amplifier circuit 504 as described in any of the embodiments above. A power supply 506 provides power (VDD) to the power amplifier, and the amplified signal is output to a load 508. Where the device 500 is a telecommunications device such as a transmitter, the load 508 may be an antenna.

A controller 510 provides a control signal to the power amplifier circuit 504, which is used to set the capacitance values of capacitors $C_1$ and $C_2$. If only one of the capacitors is variable, the control signal is used to set the capacitance value of that variable capacitor.

In embodiments of the present invention, the values of $C_1$ and/or $C_2$ can be controlled in real time in response to changes in the power supply or the load, in order to achieve a required efficiency in the power amplifier 504. The required efficiency may be the maximum attainable, or a threshold value some way below that. For example, the power supply may drop during operation of the device 500 (due to battery depletion, a power cut, etc). In response to that drop in power supply, the controller 510 may change the values of $C_1$ and $C_2$ such that the efficiency of the power amplifier circuit is nonetheless maintained. In another example, under constant power supply conditions, the device 500 may be required to deliver reduced or increased power to the load 508. In that instance, the controller 510 may change the values of $C_1$ and $C_2$ so as to increase or reduce the value of $R_x$ and maintain a desired efficiency. Various scenarios may suggest themselves to the skilled person. The controller 510 may have a look-up table or be otherwise programmed to adapt the values of $C_1$ and $C_2$ in response to a range of different values for the power supply and the load.

The present invention thus provides a power amplifier circuit in which the efficiency can be maintained at a high level for a variety of different conditions (such as the power supply and the load). In particular, by providing one or more variable capacitors, the impedance seen at the output of the amplifier can be matched to the load without changing the geometry of the transformer.

It will of course be understood that many variations may be made to the above-described embodiment without departing from the scope of the present invention.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A power amplifier circuit, comprising:
   an amplifier receiving an input signal to be amplified and one or more control signals from a controller;
   a power input coupling the amplifier to a power supply;
   a transformer providing the amplified signal from the amplifier to a load, comprising a primary inductor and a secondary inductor;
   wherein:
   a first capacitor is coupled in parallel with the primary inductor; and
   a second capacitor is coupled in parallel with the secondary inductor;
   wherein at least one of the first and second capacitors has a variable capacitance;
   wherein the controller:
   measures a change in power from the power supply under constant load, and in response to the measured change in power, retrieves one or more control signals from a lookup table and transmits the one or more control signals to change the capacitance value of the first capacitor and the capacitance value of the second capacitor sufficient to maintain the efficiency of the amplifier under the measured change in power,
   measures a change in load under constant power, and in response to the measured change in load, retrieves one or more control signals from a lookup table and transmits the one or more control signals to change the capacitance value of the first capacitor and the capacitance value of the second capacitor sufficient to maintain the efficiency of the amplifier under the measured change in load.

2. The power amplifier circuit according to claim 1, wherein both the first and second capacitors have variable capacitances.

3. The power amplifier circuit according to claim 1, wherein the first and/or second capacitors are configured to set their respective capacitances such that the amplifier operates at a given efficiency according to a power supplied by the power supply and a power requirement of the load.

4. The power amplifier circuit according to claim 3, wherein the first and/or second capacitors are configured to vary their respective capacitances to take account of a varying power supplied by the power supply.

5. The power amplifier circuit according to claim 3, wherein the first and/or second capacitors are configured to vary their respective capacitances to take account of a varying power requirement of the load.

6. The power amplifier circuit according to claim 1, wherein the first and/or second capacitors can take respective ones of a plurality of discrete capacitance values.

7. The power amplifier circuit according to claim 1, wherein the amplifier is a transistor.

8. The power amplifier circuit according to claim 7, wherein the input signal is coupled to a gate terminal of the transistor.

9. The power amplifier circuit according to claim 7, wherein the transformer is coupled to a drain terminal of the transistor.

10. A device according to claim 1, comprising one or more power amplifier circuits according to claim 1.

11. A device according to claim 10, wherein the load comprises an antenna.

* * * * *